(12) United States Patent
Graham et al.

(10) Patent No.: US 7,448,428 B2
(45) Date of Patent: Nov. 11, 2008

(54) METHOD OF CASTING

(75) Inventors: Lawrence D. Graham, Chagrin Falls, OH (US); Scott T. Hill, Mentor, OH (US)

(73) Assignee: PCC Airfoils, Inc., Beachwood, OH (US)

( * ) Notice: Subject to any disclaimer, the term of this patent is extended or adjusted under 35 U.S.C. 154(b) by 0 days.

(21) Appl. No.: 11/250,199

(22) Filed: Oct. 14, 2005

(65) Prior Publication Data
US 2007/0084581 A1    Apr. 19, 2007

(51) Int. Cl.
B22D 27/04    (2006.01)

(52) U.S. Cl. .................. 164/122.1; 164/124; 164/338.1

(58) Field of Classification Search ................. 164/124, 164/122.1, 122.2, 338.1, 123, 205.1, 259, 164/66.1, 65, 250.1
See application file for complete search history.

(56) References Cited

U.S. PATENT DOCUMENTS

| | | | |
|---|---|---|---|
| 1,074,251 A | 9/1913 | Connell | |
| 1,251,951 A | 1/1918 | Ashdown | |
| 1,789,883 A | 1/1931 | Roth | |
| 1,933,530 A | 10/1933 | Meyers et al. | |
| 2,229,507 A | 1/1941 | Johnston | |
| 2,903,760 A * | 9/1959 | Millard | 164/121 |
| 3,075,263 A * | 1/1963 | Juckniess et al. | 164/250.1 |
| 3,630,480 A | 12/1971 | Inouye | |
| 3,752,221 A | 8/1973 | Copley et al. | |
| 3,841,384 A | 10/1974 | Tingquist et al. | |
| 4,178,986 A * | 12/1979 | Smashey | 164/513 |
| 4,463,797 A | 8/1984 | Berg | |
| 4,621,676 A | 11/1986 | Steward | |
| 4,813,470 A * | 3/1989 | Chiang | 164/122.1 |
| 4,819,709 A * | 4/1989 | Lallement | 164/154.4 |
| 4,838,340 A | 6/1989 | Entrekin et al. | |
| 4,922,995 A | 5/1990 | Movchan et al. | |
| 5,046,547 A | 9/1991 | Oti | |
| 5,273,102 A | 12/1993 | Lillquist et al. | |
| 5,335,711 A * | 8/1994 | Paine | 164/66.1 |
| 5,503,215 A * | 4/1996 | Betz et al. | 164/258 |
| 5,996,677 A * | 12/1999 | Woodhouse | 164/136 |
| 6,435,257 B2 * | 8/2002 | Simkovich | 164/122.1 |
| 6,443,213 B1 | 9/2002 | Graham et al. | |
| 6,471,397 B2 * | 10/2002 | Soderstrom et al. | 374/139 |
| 6,837,299 B2 * | 1/2005 | Schlienger et al. | 164/122.2 |
| 7,038,227 B2 * | 5/2006 | Aust | 250/493.1 |

* cited by examiner

*Primary Examiner*—Kevin P Kerns
(74) *Attorney, Agent, or Firm*—Tarolli, Sundheim, Covell & Tummino LLP (57) ABSTRACT

A Method of casting includes providing a mold having one or more article mold cavities. The mold is moved into a furnace. While the mold is in the furnace, the mold is filled with molten metal. After the mold has been removed from the furnace, a heater is positioned adjacent to the mold and heat is transmitted from the heater to the mold. The heater may include electrically energizable resistance type heating elements, or a source of radiant energy or a gas burner.

57 Claims, 3 Drawing Sheets

METHOD OF CASTING

BACKGROUND OF THE INVENTION

The present invention relates to a new and improved method and apparatus for casting a metal article. A heater, which may be referred to as an auxiliary or secondary furnace, is utilized to transmit heat to a mold after the mold has been removed from a first or main furnace.

A known apparatus includes a mold having a pour cup. Molten metal is conducted from the pour cup through feeder passages to an article mold cavity. A heating coil is wrapped around a portion of the feeder passages. During and after pouring of molten metal into the pour cup, heat is provided by the heating coil to maintain metal in the feeder passages molten. An apparatus having this construction is disclosed in U.S. Pat. No. 3,752,221.

Another known apparatus is disclosed in U.S. Pat. No. 1,789,883. This patent discloses a hot-top which is positioned on an ingot mold. Electrical resistance wires are provided in the hot-top. Various hot-top constructions are also disclosed in U.S. Pat. Nos. 1,074,251; 1,933,530; 2,229,507; and 3,630,480.

SUMMARY OF THE INVENTION

The present invention relates to a new and improved method of casting. The method includes filling an article mold cavity with molten metal while a mold is in a furnace. After the mold has been removed from the furnace, a heater is positioned adjacent to the mold and heat is transmitted from the heater to the mold.

It is contemplated that the heater may have many different constructions. As examples, an embodiment of the heater having an electrically activated resistance heat source, an embodiment of the heater having a plasma heat source, and an embodiment of the heater having a gas heat source are disclosed. It should be understood that other known heat sources may be used if desired.

It is contemplated that the furnace may be located in a first housing which is evacuated. The mold may be moved into a second housing which is also evacuated. The mold is then moved from the second housing into the furnace. After molten metal has moved into the mold, the mold is moved from the furnace back into the second housing. Thereafter, heat is transmitted from the heater to the mold.

The present invention includes a plurality of different features. It is contemplated that these features may be utilized together in the manner disclosed herein. Alternatively, the features may be used separately or in various combinations with features from the prior art and other features disclosed herein. It should also be understood that the invention is not to be limited to any one of the specific embodiments disclosed herein. This is because there are many ways in which the various features of the invention may be used together or separately and in which they may be changed from the specific embodiments disclosed herein.

BRIEF DESCRIPTION OF THE DRAWINGS

The foregoing and other features of the present invention will become more apparent upon a consideration of the following description taken in connection with the accompanying drawings wherein.

DESCRIPTION OF SPECIFIC PREFERRED EMBODIMENTS OF THE INVENTION

Figure 1:
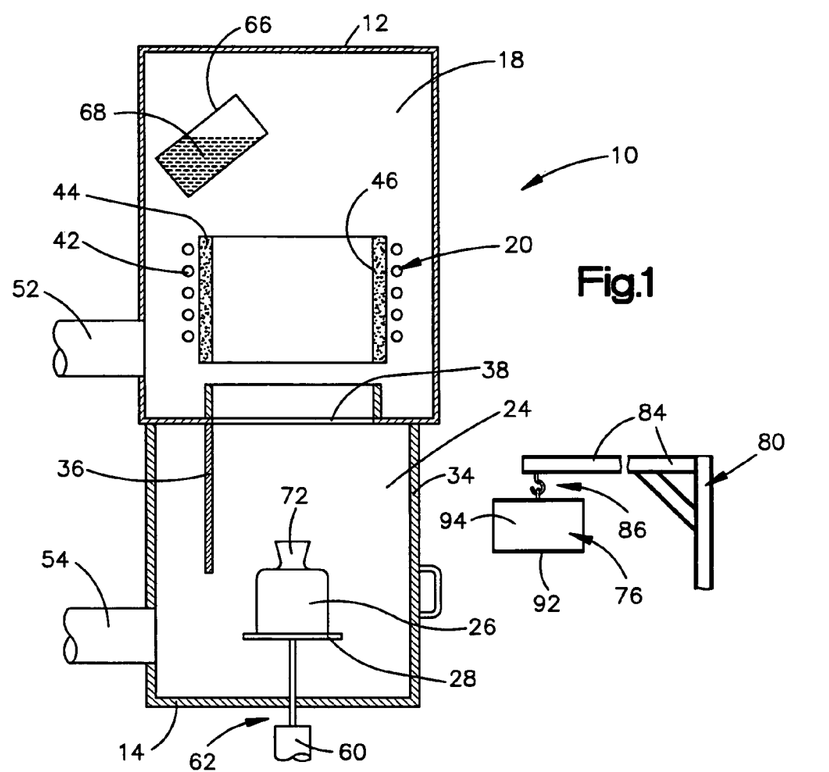
FIG. 1 is a schematic illustration depicting the relationship between a furnace, mold and heater prior to pouring the molten metal into the mold.

A casting apparatus 10 which is constructed and operated in accordance with the present invention is illustrated schematically in FIG. 1. The casting apparatus 10 includes an upper housing 12 and a lower housing 14. The upper housing 12 has a melt chamber 18 in which a furnace assembly 20 is disposed. The lower housing 14 has a loading chamber 24 in which a mold 26 is disposed.

The mold 26 is disposed on a movable support 28. The lower housing 14 includes a door 34 which can be opened to provide access to the loading chamber 24. A flapper valve or control panel 36 is pivotal to close a circular opening 38 between the melt chamber 18 and the loading chamber 24.

The furnace assembly 20 is of the known induction type and includes an induction coil 42. The helical coil 42 is located in a surrounding relationship with a cylindrical refractory wall 44. A cylindrical radiation liner 46 is provided within the refractory wall 44. If desired, a cover may be provided on an upper end portion of the refractory wall 44.

Vacuum conduits 52 and 54 are connectable with a source of vacuum or low pressure. When the door 34 is closed and the flapper valve 36 is in the open condition illustrated in FIG. 1, the conduits 52 and 54 are both connected with a source of low pressure to evacuate the melt chamber 18 and the loading chamber 24. Prior to opening of the door 34, the flapper valve 36 is closed and the conduit 54 is connected to atmospheric pressure. This results in the evacuated atmosphere being maintained in the melt chamber 18 while the door 34 is opened to provide access to the loading chamber 24. The furnace assembly 20, upper housing 12 and lower housing 14 may have any one of many known constructions. It is believed that the furnace assembly 20 and upper and lower housings 12 and 14 may be constructed in the same manner as is disclosed in U.S. Pat. Nos. 3,841,384 and/or 5,335,711.

When the mold 26 is to be utilized to form a cast metal article, the flapper valve 36 is closed. The loading chamber 24 is then exhausted to atmosphere. At this time, the melt chamber 18 is maintained in an evacuated condition. The door 34 to the loading chamber 24 is then opened. The mold 26 is placed on the mold support 28. The mold support 28 may then be lowered to move the mold 26 into the lower end portion of the loading chamber 24. The door 34 is then closed.

Next, the vacuum conduit 54 is connected with a source of vacuum or low pressure to evacuate the closed loading chamber 24. Once the loading chamber has been evacuated, the flapper valve 36 is moved to the open condition of FIG. 1. A piston and cylinder type motor 60 in a mold support drive assembly 62 is then operated to raise the mold support 28 and mold 26 upwardly into the evacuated melt chamber 18 and the upper housing 12. As the mold 26 is moved upwardly, the mold moves into the furnace assembly 20.

While the mold 26 is disposed in the furnace assembly 20, the mold is heated to a temperature between 2,500 degrees Fahrenheit and 3,000 degrees Fahrenheit. At this time, the fluid pressure in the melt chamber 18 may be between $6 \times 10^{-4}$ atmospheres and slightly less than 1.0 atmosphere. It should be understood that the specific temperatures and pressures in the furnace assembly 20 and melt chamber 18 may vary depending upon the characteristics of the molten metal to be poured into the mold 26. It is contemplated that other temperatures and pressures may and will be utilized.

Once the mold 26 has been heated to the desired temperature in the furnace assembly 20, the mold is filled with a molten nickel-chrome super alloy or other metal. The molten metal 68 poured into a funnel shaped pour cup 72 by tilting a crucible 66. The molten metal 68 was from the pour cup 72 through a gating system (not shown) into one or more article mold cavities in the mold 26. It is contemplated that the mold 26 may have a construction similar to the constructions disclosed in U.S. Pat. Nos. 3,680,625; 4,550,764; 4,862,947; and/or 4,969,501. However, it is contemplated that the mold 26 may have any desired construction and will have constructions which are different than the aforementioned constructions.

In the specific embodiment of FIG. 1, the molten metal 68 with which the mold 26 is filled is a nickel-chrome super alloy. However, it is contemplated that the mold 26 may be filled with a different metal if desired. For example, the mold 26 may be filled with titanium.

Shortly after the mold 26 is filled with molten metal, the motor 60 in the mold support assembly 62 is operated to lower the movable support 28 and mold 26. As this occurs, the mold moves downwardly from the furnace assembly 20 through the opening 38 into the evacuated loading chamber 24.

The mold 26 is lowered downwardly through the position illustrated in FIG. 1 to a position in which the mold is disposed adjacent to the lower end of the loading chamber 24. This provides clearance for the flapper valve 36 to move from the open position of FIG. 1 back to the closed position. The evacuated loading chamber 24 is then vented to atmosphere through the conduit 54. However, the melt chamber 18 remains in an evacuated condition. Once the loading chamber 24 has been vented to atmosphere, the door 34 is opened to provide access to the mold 26.

In accordance with a feature of the present invention, a heater 76 is positioned adjacent to the mold 26. The heater 76 is moved toward the mold 26 by a heater positioning apparatus 80. When the heater 76 is adjacent to the mold 26, the heater is effective to radiate heat to the upper portion of the mold 26. Heat radiated from the heater 76 is effective to heat the pour cup 72 and gating connecting the pour cup with one or more article mold cavities disposed in the mold 26. The heat provided by the heater 76 maintains the metal in the upper end portion of the mold 26 molten while the metal in the lower end portion of the mold solidifies.

Figure 2:
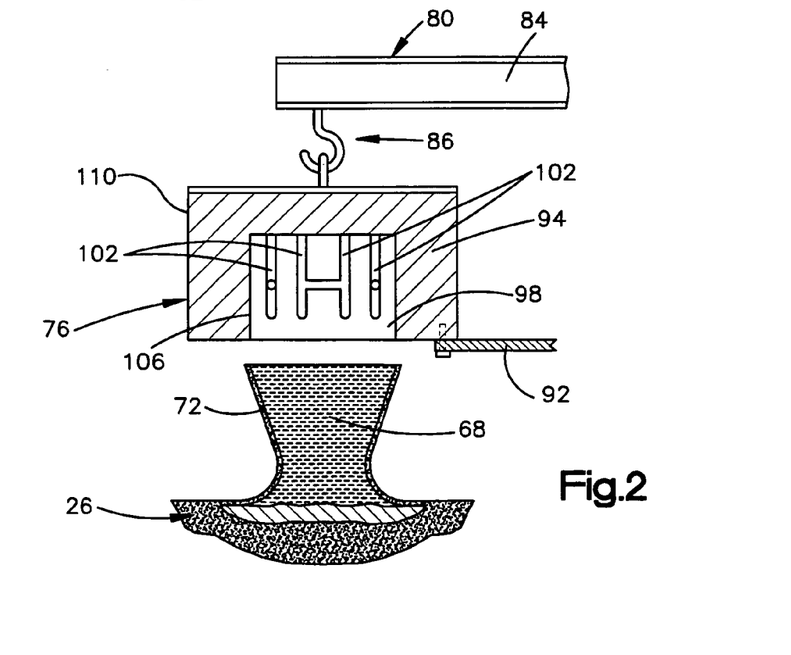
FIG. 2 is an enlarged fragmentary schematic illustration depicting the relationship of the heater to the mold after the mold has been filled with molten metal.

In the embodiment of the invention illustrated in FIG. 1, the heater positioning apparatus 80 includes an arm or beam 84 which is releasably connected with the heater 76 by a connector assembly 86 (FIGS. 1 and 2). Although the illustrated connector assembly is of the hook and eye type, any one of many known connector assemblies may be utilized if desired. For example, an electromagnet may be provided on the arm 84 to attract a metal panel on the upper end of the heater 76.

When the door 34 has been opened, the heater positioning apparatus 80 moves the arm 84 into the vented loading chamber 24 to align the heater 76 with the pour cup 72, in the manner illustrated schematically in FIG. 2. At this time, the heater 76 spans the upper end of the pour cup 72. Either immediately prior to movement of the heater into the loading chamber 24 or after the heater has been aligned with the pour cup 72, a generally circular shutter panel 92 is pivoted relative to a body or base 94 of the heater 76 to move the shutter from the closed position of FIG. 1 to the open position of FIG. 2. This exposes the still molten metal in the pour cup 72 to a heating chamber or cavity 98 (FIG. 2) in the body 94 of the heater 76.

Heating elements 102 (FIG. 2) in the heating chamber 98 are exposed to the molten metal 68 in the pour cup 72. The heat radiated from the heating cavity 98 to the molten metal 68 in the pour cup 72 maintains the metal in the pour cup molten while the metal solidifies in one or more cavities in the article mold 26. This enables metal to be fed from the pour cup 72 and the gating system connected with the pour cup to the article mold cavity or cavities as the metal in an article mold cavity solidifies.

In the embodiment of the invention illustrated in FIG. 2, the heating elements 102 are molydisilicide resistance heating elements which are electrically energized. The molydisilicide heating elements are hung along a cylindrical inner side surface 106 of the heating chamber 98. The body 94 is formed of a heat insulating material which retards radiation of heat from a cylindrical outer side surface 110 of the heater 76. The body 94 spans and is aligned with the upper end of the pour cup 72.

The heater positioning arm 84 moves the heater 76 into axial alignment with a circular upper end of the pour cup 72. This results in heat being directly radiated from the heating chamber or cavity 98 to the molten metal 68 in the pour cup 72. In the embodiment of the invention illustrated in FIG. 2, the heater is spaced a short distance from and extends across the upper end of the pour cup 72. If desired, the heater 76 may be positioned in engagement with the upper end of the pour cup. Although it is believed that it will be preferred to utilize the shutter panel 92 to prevent loss of heat from the heating chamber cavity 98 before the heater 76 is positioned relative to the mold 26, the shutter panel may be omitted if desired. in the embodiment of the invention illustrated in FIG. 2, the heating elements 102 are molydisilicide heating elements. It is contemplated that other known types of heating elements may be utilized if desired. For example, an induction coil heating element may be utilized in association with a graphite susceptor wall. Alternatively, a coil of electric resistance conductor, may be utilized in association with suitable refractory material. It is contemplated that the heater 76 may and probably will have a construction which is different from the specific construction illustrated in FIG. 2.

In the embodiment of the invention illustrated in FIG. 1, the heater 76 is moved from a location outside of the lower housing 14 to a position adjacent to the mold 26 while the mold is in the lower housing. However, it is contemplated that the heater 76 and heater positioning apparatus 80 may be located within the loading chamber 24. If this is done, the heater 76 may be moved into alignment with the mold 26 prior to opening of the door 34. This would allow the heater 76 to be positioned adjacent to the mold 26 while the loading chamber 24 is still evacuated.

It is believed that it may be advantageous to move the heater 76 to a position adjacent to the mold 26 while the mold is still in the loading chamber 24. However, the mold 26 may be moved from the loading chamber 24 to a location disposed outside of the lower housing 14 before the heater 76 is positioned adjacent to the mold 26. Thus, after the flapper valve 36 has been closed and the loading chamber 24 vented to an atmosphere, the door 34 may be opened. The mold 26 may be then be moved out of the lower housing 14. Once the mold has been moved out of the lower housing 14, the heater positioning apparatus 80 may be used to position the heater 76 adjacent to the mold 26, in the manner shown schematically in FIG. 2.

The molten metal 68 in the mold 26 (FIG. 2) solidifies with an equiaxed grain structure. However, the molten metal may be solidified with a different grain structure if desired. For example, the molten metal 68 may be solidified with a single crystal grain structure. Alternatively, the molten metal 68 may be solidified with a columnar grain structure.

In the embodiment of the invention illustrated in FIGS. 1 and 2, the heater 76 is positioned above the mold 26. In the embodiment of the invention illustrated in FIG. 3, the heater extends around a portion of the mold. Since the embodiment of the invention illustrated in FIG. 3 is generally similar to the embodiment of the invention illustrated in FIGS. 1 and 2, similar numerals will be utilized to designate similar components, the suffix letter "a" being associated with the numerals of FIG. 3 to avoid confusion.

Figures 3, 4:
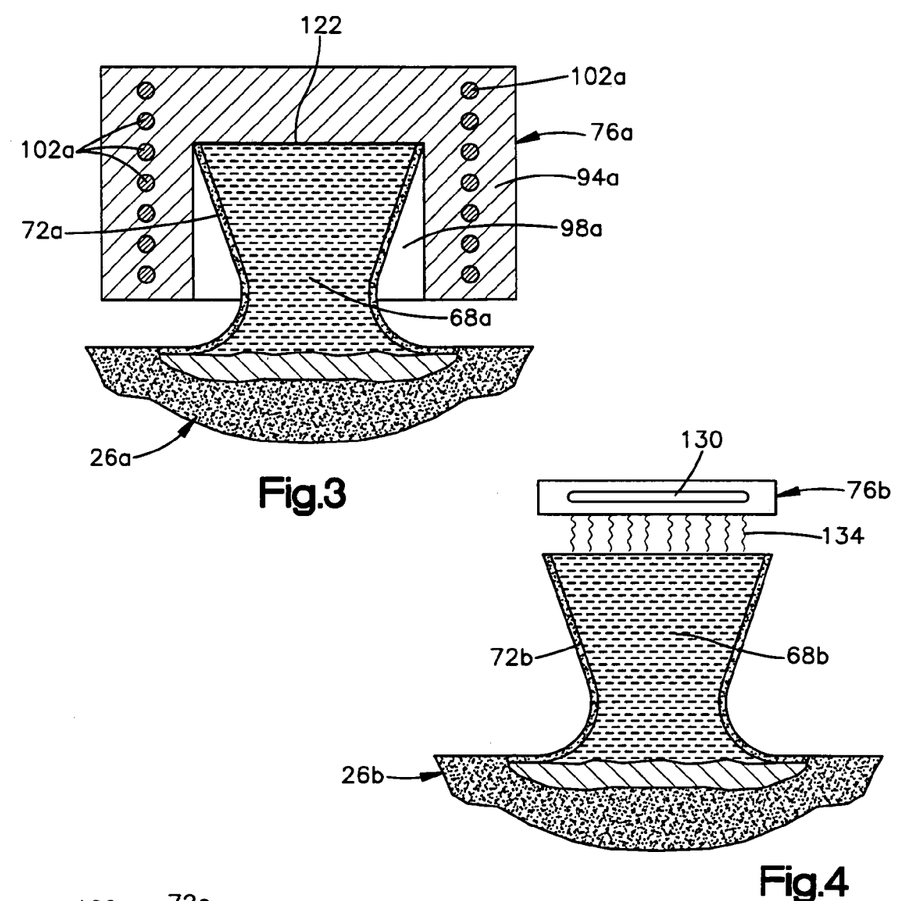
FIG. 3 is a schematic illustration of an embodiment of the heater which at least partially encloses the mold.
FIG. 4 is a schematic illustration of an embodiment of a heater having a plasma heat source.

A mold 26a has a generally funnel shaped pour cup 72a (FIG. 3). The pour cup 72a contains molten metal 68a. The pour cup 72a is connected in fluid communication with one or more mold cavities, disposed within the mold 26a, by a suitable gating system. The molten metal 68a extends from the pour cup 72a through the gating system to upper end portions of one or more article mold cavities.

In accordance with a feature of the embodiment of the invention illustrated in FIG. 3, a heater 76a extends around a portion of mold 26a. Specifically, the heater 76a encloses the pour cup 72a. However, the heater 76a may be constructed so as to enclose a different portion of the mold 26a. For example, the heater may be constructed so as to enclose the pour cup 72a and at least a portion of a gating system connected with the pour cup.

In FIG. 3, the heater 76a has been illustrated as resting on the pour cup 72a. However, it is contemplated that the heater 76a may be supported by apparatus corresponding to the heater positioning apparatus 80 of FIG. 1. If this is done, a flat circular end surface 122 (FIG. 3) of the cylindrical heating chamber or cavity 98a would be disposed above and span the pour cup 72a. If desired, the heater 76a may enclose a portion of the gating system and/or upper ends of article mold cavities in addition to or instead of the pour cup 72a. It is contemplated that a suitable connector assembly, corresponding to the connector assembly 86 of FIG. 2, will be provided between the heater 76a and a heater positioning apparatus corresponding to the heater positioning apparatus 80 of FIGS. 1 and 2.

The heater 76a (FIG. 3) includes a cylindrical body or base 94a. A helical heating element 102a is embedded in the body or base 94a of the heater. The heating element 102a is electrically energized to provide heat which is transmitted through the body or base 94a to the pour cup 72a.

The illustrated heating element 102a is an electrical resistance heating element. However, the heating element 102a may be an induction coil which is associated with a graphite susceptor which extends around a portion of the article mold 26a. Of course, other known types of heaters may be utilized if desired.

In the embodiment of the invention illustrated in FIG. 3, the heater 76a encloses the pour cup 72a. It is contemplated that the heater 76a may be constructed so as to enclose a portion of the mold 26a which is spaced from the pour cup, for example, a portion of the gating system and/or an upper end portion of one or more article mold cavities. Of course, the heater 76a may enclose at least a portion of the pour cup 72a, at least a portion of the gating system, and at least a portion of the mold 26a in which an article mold cavity is disposed.

It is contemplated that the heater 76a may be positioned adjacent to the pour cup 72a, in the manner illustrated in FIG. 3, while the mold 26a is still in a lower housing corresponding to the lower housing 14 of the casting apparatus 10 of FIG. 1. If the heater 76a (FIG. 3) is positioned adjacent to the mold 26a while the mold is still in the casting apparatus, the heater may be placed adjacent the mold while the mold is in an evacuated chamber or after the chamber has been vented to atmosphere. Of course, the heater 76a may be positioned adjacent to the mold 26a after the mold has been moved out of the casting apparatus.

In the embodiment of the invention illustrated in FIG. 3, the lower end of the cylindrical heating chamber 98a is always exposed to the environment around the heater 76a. It is contemplated that a shutter panel, corresponding to the shutter panel 92 of FIG. 2, may be provided in association with the heater 76a. The shutter panel would be movable between a closed position blocking heat radiation from the heating chamber 98a and an open position enabling heat to be radiated from the heating chamber.

In the embodiments of the invention illustrated in FIGS. 1-3, electrical resistance heating elements 102 and 102a have been utilized in association with the heaters 76 and 76a. In the embodiment of the invention illustrated in FIG. 4, a source of radiant energy is utilized as a heat source. Since the embodiment of the invention illustrated in FIG. 4 is generally similar to the embodiments of the invention illustrated in FIGS. 1-3, similar numerals will be utilized to identify similar components, the suffix letter "b" being associated with the numerals of FIG. 4 to avoid confusion.

A mold 26b has a pour cup 72b in which molten metal 68b is disposed. A heater 76b is disposed adjacent to and spans the pour cup 72b. The heater 76b has a radiant energy source, indicated schematically at 130 in FIG. 4. The radiant energy source 130 is a plasma lamp. However, other radiant energy sources, such as a plasma arc or plasma torch, may be utilized. Alternatively, a laser or an electron beam gun may be used as a source of radiant energy. It is contemplated that any known source of radiant energy may be substituted for the energy source 130.

In the embodiment of the invention illustrated in FIG. 4, radiant energy, indicated schematically at 134 in FIG. 4, is directed directly downward toward the open upper end of the pour cup 72b and the molten metal 68b disposed in the pour cup. However, if desired, radiant energy, corresponding to the radiant energy 134, may be directed onto a portion of the mold 26b spaced from the pour cup.

For example, radiant energy may be directed from a heater, corresponding to heater 76b, onto the gating system portion of the mold 26b. In addition or alternatively, radiant energy may be directed onto the portion of the mold 26b which encloses upper end portions of one or more article mold cavities. Of course, radiant energy may be directed onto one or more of these portions of the mold 26b and onto the pour cup 72b.

Assuming that the heater 76b is constructed so as to direct radiant energy onto the molten metal 68b in the pour cup 72b and onto the outer surface of portions of the mold 26b enclosing the gating system and upper end portions of article mold cavities, heat may be directed at different rates to different portions of the article mold. Thus, heat may be directed at a relatively high rate toward the pour cup 72b and directed at a relatively low rate at portions of the mold 26b which enclose the upper end portions of article mold cavities.

The heater 76b may be constructed in such a manner as to enable the transmission of radiant energy 134 to one portion of the mold 26b to be interrupted while the transmission of radiant energy to another portion of the mold is maintained. For example, the transmission of radiant energy to the molten metal 68b in the pour cup may be maintained while the transmission of radiant energy to the portion of the mold 26b enclosing upper ends of the article mold cavities may be interrupted. The transmission of radiant energy to portions of the mold 26b enclosing the gating system may be interrupted after interruption of the transmission of radiant energy to the portion of the mold 26b enclosing the upper end portions of article mold cavities. Finally, the transmission of radiant energy from the heater 76b to the portion of the mold 26b enclosing the pour cup 72b may be interrupted.

In the embodiment of the invention illustrated in FIG. 4, the heater 76b is positioned adjacent to the mold 26b while the mold is in a vented loading chamber in the same manner as in which the heater 76 of FIG. 1 is positioned adjacent to the mold 26 of FIG. 1. However, it is contemplated that the heater 76b may be positioned adjacent to the mold 26b while the mold is still in a casting apparatus, corresponding to the casting apparatus 10, and prior to venting of an evacuated chamber enclosing the mold. Alternatively, a heater 76b may be positioned adjacent to the mold 26b after the mold has been removed from a casting apparatus, corresponding to a casting apparatus 10 of FIG. 1.

Figure 5:
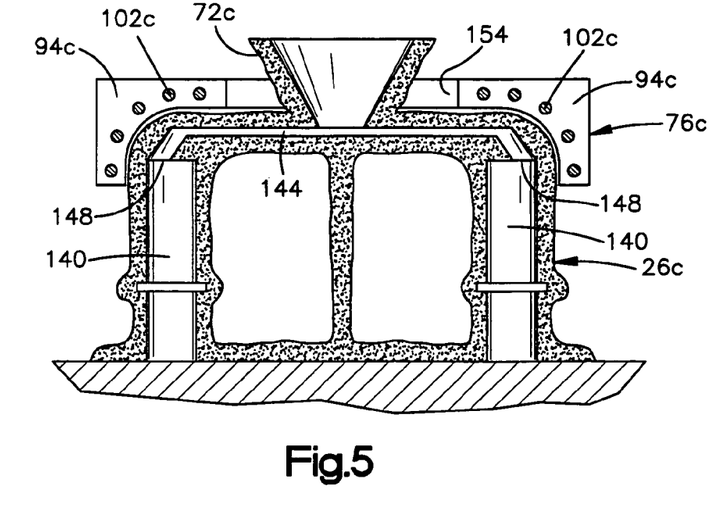
FIG. 5 is a schematic illustration of an embodiment of a heater which is placed adjacent to a gating system and upper end portions of article molds.

In the embodiments of the invention illustrated in FIGS. 1-4, the illustrated heaters 76, 76a and 76b are positioned adjacent to the pour cups of the molds. In the embodiment of the invention illustrated in FIG. 5, the heater is positioned adjacent to the gating system and upper end portions of article mold cavities. Since the embodiment of the invention illustrated in FIG. 5 is generally similar to the embodiments of the invention illustrated in FIGS. 1-4, similar numerals will be utilized to designate similar components, the suffix letter "c" being associated with the embodiment of the invention illustrated in FIG. 5 to avoid confusion.

A mold 26c has a plurality of article mold cavities 140 which are connected in fluid communication with a pour cup 72c through a gating system 144. The mold 26c has a known structure, similar to the structure illustrated in U.S. Pat. No. 4,667,728. It is contemplated that the mold 26c may have a structure which is substantially different than the illustrated mold structure.

A heater 76c is disposed adjacent to upper end portions 148 of the article mold cavities 140 and to portions of the gating system 144. The heater 76c includes a heat insulating, refractory base 94c in which coil type heating element 102c is disposed. The base 94c has a generally annular configuration and includes a circular central opening 154 which extends around the pour cup 72c. The base 94c and heating element 102c extend along the gating system 144 and downwardly along the upper end portions 148 of the article mold cavities 140.

It is contemplated that the base 94c and/or heating element 102c may be constructed so as to enclose the pour cup 72c, in much the same manner as in which the heater 76a of FIG. 3 encloses a pour cup 72a. This would result in the heater 76c enclosing a portion of the pour cup 72c and extending along portions of the mold in which the gating system 144 and upper end portions 148 of the article mold cavities 140 are disposed. Of course, the heater 76b may have a different configuration if desired.

In the embodiments of the invention illustrated in FIGS. 1-5, a single heater has been utilized in association with each of the molds. However, it is contemplated that a plurality of heaters may be provided in association with only one mold. For example, a plurality of heaters may be provided in association with the mold 26c. A separate heater may be disposed adjacent to the upper end portion 148 of each of the article mold cavities. A heater which is separate from the heaters adjacent to the upper end portions of the article mold cavities may be provided adjacent to a portion of the mold 26c enclosing the gating system 144.

By providing separate heaters in association with different portions of the mold 26c, heat may be transmitted at different rates to different portions of the mold. Some of the heaters may be energized while other heaters are deenergized. Alternatively, some of the heaters may have heating elements which are capable of radiating heat at a relatively high rate while other heaters may have heating elements which are capable of radiating heat at a lower rate. The heating elements may have any desired construction, such as any one or a combination of the constructions illustrated in FIGS. 2-5.

In the embodiments of the invention illustrated in FIGS. 1-5, heaters having electrically energizable heating elements or a radiant energy source are utilized. In the embodiment of the invention illustrated in FIGS. 6 and 7, a gas burner is utilized as the heat source. Since the embodiment of the invention illustrated in FIGS. 6 and 7 is generally similar to the embodiments of the invention illustrated in FIGS. 1-5, similar numerals will be utilized to designate similar components, the suffix letter "d" being associated with the numerals of FIGS. 6 and 7 to avoid confusion.

A mold 26d has a generally funnel shaped pour cup 72d. The pour cup 72d contains molten metal 68d. The pour cup 72d is connected in fluid communication with one or mold cavities disposed within the mold 26d by a suitable gating system. The molten metal 68d extends from the pour cup 72d through the gating system to upper end portions of one or more article mold cavities.

Figure 6:
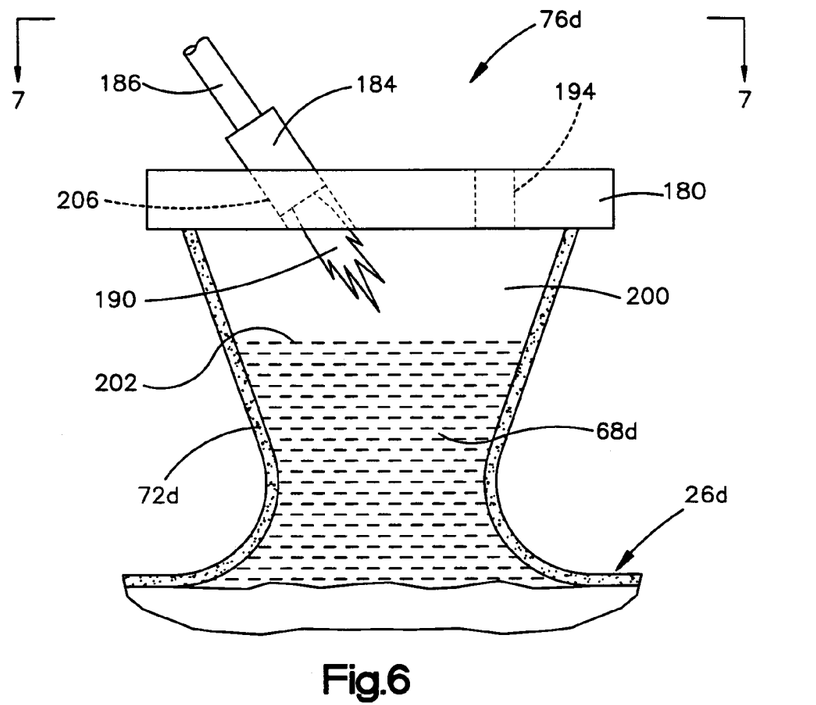
FIG. 6 is a schematic illustration of an embodiment a heater having a gas burner heat source.
Figure 7:
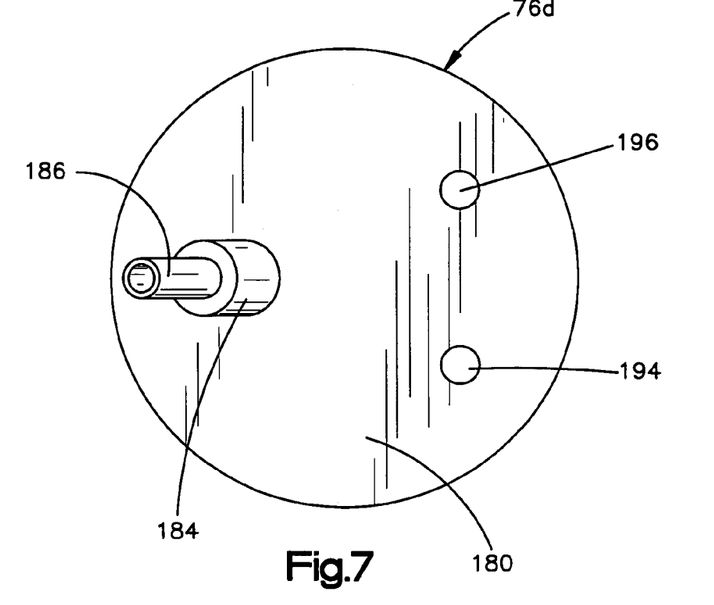
FIG. 7 is a top plan view, taken generally along the line 7-7 of FIG. 6, further illustrating the embodiment using a gas burner as a heat source.

In accordance with a feature of the embodiment of the invention illustrated in FIGS. 6 and 7, a gas heater 76d is disposed adjacent to and spans the pour cup 72d. The heater 76d includes a base which rests on the pour cup 72d. However, it is contemplated that the heater 76d may be supported by apparatus corresponding to the heater positioning apparatus 80 (FIG. 1). The illustrated base 180 has a circular disc shaped configuration. However, the base of the heater 76d may have a cylindrical cup shape configuration, similar to the heater 76a of FIG. 3. If desired, the heater 76d may enclose upper end portions of one or more article mold cavity in the manner similar to the heater 76c of FIG. 5.

The gas heater 76d includes a gas burner 184 which is connected to the base 180 and extends through the base. The gas burner 184 is connected in fluid communication with a source of gas by a conduit 186. A flame 190 is directed from the gas burner 184 toward the upper surface of the molten metal 68d in the pour cup 72d.

A plurality of exhaust gas openings 194 and 196 have formed in the base 180. The exhaust gas openings 194 and 196 enable gas to escape from a pour cup chamber 200 formed between an upper surface 202 of molten metal 68d in the pour cup and the base 180. The gas burner 184 extends through an opening 206 which is formed in the base 180 in a portion of the base which is diametrically opposite from the portion of the base in which exhaust gas openings 194 and 196 are formed. Although two exhaust gas openings 194 and 196 are formed in the base 180, a greater or lesser number of exhaust gas openings may be provided in the base 180 if desired.

In the embodiment of the invention illustrated in FIGS. 6 and 7, a single gas burner 184 is mounted on the base 180.

However, a greater number of gas burners may be provided if desired. Although a gun or torch type gas burner 184 has been illustrated schematically in FIGS. 6 and 7, it is contemplated that a different type of gas burner may be utilized if desired. For example, a ring type gas burner may be utilized.

The conduit 186 connects the gas burner 184 with a source of gas. The source of gas may be a source of natural gas. Alternatively, the source of gas may be a source of acetylene gas. Of course, other known gases may be conducted through the conduit 186 to the burner 184. The gas is ignited at the burner 184 and exposed to the molten metal 68*d* in the pour cup 72*d* to maintain the metal in a molten condition.

By using a heater, corresponding to any one of the heaters previously described in connection with the embodiments of the invention illustrated in FIGS. 1-7, molten metal is maintained in the pour cup and/or the gating system of the mold. This enables the molten metal to be fed into article mold cavities as the molten metal in the article mold cavities solidifies. The resulting cast articles will be relatively free of porosity and other defects.

By providing heaters in association with a mold, the amount of metal which is contained in the mold may be reduced. Thus, the amount of metal in the gating system and/or pour cup may be reduced. Reducing the amount of metal in the gating system reduces the total cost of forming cast articles. By reducing the volume of metal in the gating system the cost of casting the articles is reduced. In addition, the use of insulating wraps in association with the mold is minimized.

In view of the foregoing description, it is apparent that the present invention provides a new and improved apparatus and method for casting. The method includes filling an article mold cavity with molten metal 68 while a mold 26 is in a furnace 20. After the mold 26 has been removed from the furnace 20, a heater 76 is positioned adjacent to the mold and heat is transmitted from the heater to the mold.

It is contemplated that the heater 76 may have many different constructions. As examples, an embodiment of the heater 76 having an electrically activated resistances 102 (FIGS. 2, 3 and 5) as a heat source, an embodiment of the heater having a plasma heat source 130 (FIG. 4), and an embodiment of the heater having a gas heat source (FIG. 6) are disclosed. If desired, the heater 76 may be constructed so as to have electrically activated resistances 102 and/or a plasma heat source 130 and/or a gas heat source 184. It should be understood that other known heat sources may be used if desired.

It is contemplated that the furnace 20 may be located in a first housing 12 (FIG. 1.) which is evacuated. The mold 26 may be moved into a second housing 14 which is also evacuated. The mold 26 is then moved from the second housing 14 into the furnace 20. After molten metal 68 has moved into the mold 26, the mold is moved from the furnace 20 back into the second housing 14. Thereafter, heat is transmitted from the heater 72 to the mold 26.

Having described the invention, the following is claimed:

1. A method of casting, said method comprising the steps of providing a mold having at least one article mold cavity, moving the mold into a furnace, filling the at least one article mold cavity with molten metal while the mold is in the furnace, removing the mold from the furnace with metal in the mold, thereafter, positioning a heater above the mold, said step of positioning the heater above the mold includes moving the heater relative to the furnace, moving a panel from a position blocking an entrance to a chamber in the heater to a position in which the panel is ineffective to block the entrance to the chamber in the heater, and transmitting heat from the chamber in the heater to metal in the mold after moving the panel to the position in which the panel is ineffective to block the entrance to the chamber in the heater, said step of transmitting heat from the chamber in the heater to metal in the mold is at least partially performed with the heater above the mold.

2. A method as set forth in claim 1 wherein said step of filling the article mold cavity with molten metal while mold is in the furnace includes moving molten metal through a pour cup into the article mold cavity, said step of positioning the heater above the mold includes positioning at least a portion of the pour cup in the chamber in the heater after moving the panel to a position in which the panel is ineffective to block the entrance to the chamber in the heater.

3. A method as set forth in claim 2 wherein said step of transmitting heat from the heater to the metal in the mold after removing the mold from the furnace includes radiating energy from a source of radiant energy toward metal in the pour cup with the pour cup in the chamber in the heater.

4. A method as set forth in claim 2 wherein said step of positioning the pour cup in the chamber in the heater includes engaging an upper end portion of the pour cup with the heater.

5. A method as set forth in claim 2 wherein said step of positioning at least a portion of the pour cup in the chamber of the heater includes spanning an upper end of the pour cup with the heater.

6. A method as set forth in claim 2 wherein said step of positioning at least a portion of the pour cup in the chamber of the heater includes maintaining the heater spaced from the pour cup.

7. A method as set forth in claim 1 wherein the mold includes a plurality of article mold cavities which are interconnected by a gating system, said step of filling the at least one article mold cavity with molten metal includes conducting molten metal through the gating system to the plurality of article mold cavities, said step of positioning the heater above the mold includes positioning the heater adjacent to and directly above the gating system and upper end portions of the plurality of article mold cavities.

8. A method as set forth in claim 1 wherein said step of transmitting heat from the heater to the metal in the mold includes radiating energy from the chamber of the heater toward the mold with the heater disposed above the mold.

9. A method as set forth in claim 1 wherein said step of positioning a heater above the mold includes positioning a heater having a plasma energy source above the mold, said step of transmitting heat from the heater to metal in the mold includes transmitting energy from the plasma energy source toward a portion of the mold aligned with the chamber of the heater with the heater disposed above the mold.

10. A method as set forth in claim 1 wherein said step of positioning a heater above the mold includes positioning a heater having a gas burner above the mold, said step of transmitting heat from the heater to metal in the mold includes transmitting heat from burning gas with the heater disposed above the mold.

11. A method as set forth in claim 1 further including the step of solidifying metal in the at least one article mold cavity with an equiaxed grain structure while performing said step of transmitting heat from the heater to metal in the mold.

12. A method as set forth in claim 1 further including the steps of maintaining a vacuum in a first housing which encloses the furnace during filling of the at least one article mold cavity with molten metal, said step of removing the mold from the furnace includes moving the mold from the first housing to a second housing, said step of positioning a heater above the mold is performed while the mold is in the second housing.

13. A method as set forth in claim 12 further including the step of moving the heater into the second housing while the mold is in the second housing.

14. A method as set forth in claim 12 further including the step of maintaining a vacuum in the second housing during movement of the mold from the first housing into the second housing and during positioning of the heater above the mold.

15. A method as set forth in claim 1 wherein gas is conducted to the heater and burned during performance of said step of transmitting heat from the heater to metal in the mold.

16. A method as set forth in claim 1 wherein said step of moving the panel from a position in which the panel blocks an entrance to the chamber in the heater to a position in which the panel is ineffective to block the entrance to the chamber in the heater includes pivoting the panel relative to the heater.

17. A method of casting, said method comprising the steps of providing a mold having a pour cup and at least one article mold cavity, moving the mold into a furnace, filling the at least one article mold cavity with molten metal while the mold is in the furnace by conducting a flow of molten metal into the pour cup, removing the mold from the furnace, thereafter, effecting relative movement between a heater and the mold to position the mold and heater relative to each other with the heater disposed above the mold and with at least a portion of the pour cup disposed in a chamber in the heater, and transmitting heat from the heater to metal in the pour cup while at least a portion of the pour cup is disposed in the chamber in the heater and while a lower portion of the mold is disposed outside the chamber in the heater.

18. A method as set forth in claim 17 further including the step of moving a panel from a position blocking an entrance to the chamber in the heater to a position in which the panel is ineffective to block the entrance to the chamber in the heater while the pour cup is disposed outside the chamber in the heater.

19. A method as set forth in claim 17 wherein said step of transmitting heat from the heater to metal in the pour cup is performed with the heater spaced from the pour cup.

20. A method as set forth in claim 17 wherein said step of transmitting heat from the heater to metal in the pour cup is performed with the heater in engagement with the pour cup.

21. A method as set forth in claim 17 wherein said step of transmitting heat from the heater to the metal in the pour cup includes radiating energy from a source of radiant energy toward metal in the pour cup.

22. A method as set forth in claim 17 wherein said step of effecting relative movement between the heater and the mold includes spanning an upper end of the pour cup with the heater.

23. A method as set forth in claim 17 wherein the mold includes a plurality of article mold cavities which are interconnected by a gating system, said step of filling the at least one article mold cavity with molten metal includes conducting molten metal through the gating system to the plurality of article mold cavities, said step of effecting relative movement between the heater and the mold includes positioning the heater adjacent to and directly above upper end portions of the plurality of article mold cavities.

24. A method as set forth in claim 17 wherein said step of transmitting heat from the heater to the metal in the pour cup includes radiating energy from a source of energy toward the pour cup.

25. A method as set forth in claim 17 wherein said step of effecting relative movement between the heater and the mold includes positioning a heater having a plasma energy source adjacent to the mold, said step of transmitting heat from the heater to metal in the pour cup includes transmitting energy from the plasma energy source toward the mold.

26. A method as set forth in claim 17 wherein said step of effecting relative movement between the heater and the mold includes positioning a heater having a gas burner adjacent to the mold, said step of transmitting heat from the heater to metal in the pour cup includes transmitting heat from burning gas to metal in the pour cup.

27. A method as set forth in claim 17 further including the step of solidifying metal in the at least one article mold cavity with an equiaxed grain structure while performing said step of transmitting heat from the heater to metal in the pour cup.

28. A method as set forth in claim 17 further including the steps of maintaining a vacuum in a first housing which encloses the furnace during filling of the at least one article mold cavity with molten metal, said step of removing the mold from the furnace includes moving the mold from the first housing to a second housing, said step of effecting relative movement between the heater and the mold is performed while the mold is in the second housing.

29. A method as set forth in claim 28 further including the step of moving the heater into the second housing while the mold is in the second housing.

30. A method as set forth in claim 28 further including the step of maintaining a vacuum in the second housing during movement of the mold from the first housing into the second housing and during performance of said step of effecting relative movement between the heater and the mold.

31. A method as set forth in claim 17 wherein gas is conducted to the heater and burned during performance of said step of transmitting heat from the heater to metal in the pour cup.

32. A method of casting, said method comprising the steps of providing a mold having a pour cup which is connected in fluid communication with a plurality of article mold cavities by a gating system, moving the mold into a furnace, filling the article mold cavities, gating system, and pour cup with molten metal while the mold is in the furnace, removing the mold from the furnace, thereafter, positioning a heater adjacent to the mold, said step of positioning a heater adjacent to the mold includes positioning a heater directly above upper end portions of the article mold cavities and the gating system with at least a portion of the heater disposed at a lower level than an upper end portion of the pour cup, and transmitting heat from the heater to metal in the upper end portions of the article mold cavities and the gating system after removing the mold from the furnace.

33. A method as set forth in claim 32 wherein said step of filling the article mold cavity with molten metal while the mold is in the furnace includes moving molten metal through the pour cup and gating system into the article mold cavities, said step of positioning the heater adjacent to the mold includes positioning the heater with the pour cup extending into an opening in the heater.

34. A method as set forth in claim 33 wherein said step of transmitting heat from the heater to the metal in the upper end portions of the article mold cavities and the gating system after removing the mold from the furnace includes radiating energy from a source of radiant energy toward the metal in the upper end portions of the article mold cavities and the gating system.

35. A method as set forth in claim 33 wherein said step of positioning the heater adjacent to the pour cup includes enclosing at least a portion of the pour cup with the heater.

36. A method as set forth in claim 33 wherein said step of positioning the heater adjacent to the mold includes engaging the mold with the heater.

37. A method as set forth in claim 33 further including the steps of maintaining a vacuum in a first housing which encloses the furnace during filling of the article mold cavities, gating system, and pour cup with molten metal, said step of removing the mold from the furnace includes moving the mold from the first housing to a second housing, said step of positioning a heater adjacent to the mold is performed while the mold is in the second housing.

38. A method as set forth in claim 37 further including the step of moving the heater into the second housing while the mold is in the second housing.

39. A method as set forth in claim 37 further including the step of maintaining a vacuum in the second housing during movement of the mold from the first housing into the second housing and during positioning of the heater adjacent to the mold.

40. A method of casting, said method comprising the steps of providing a mold having a pour cup and at least one article mold cavity, moving the mold into a furnace, filling the at least one article mold cavity with molten metal while the mold is in the furnace by conducting a flow of molten metal into the pour cup, removing the mold from the furnace, and, thereafter, positioning a heater adjacent to the pour cup, said step of positioning a heater adjacent to the pour cup includes spanning an upper end portion of the pour cup with the heater, and transmitting heat from the heater to metal in the pour cup after removing the mold from the furnace, said step of transmitting heat from the heater to the metal in the pour cup includes conducting a flow of gas to the heater, burning the gas, and transmitting heat from the burning gas to the upper end portion of the pour cup.

41. A method as set forth in claim 40 wherein said step of positioning the heater adjacent to the pour cup includes enclosing at least a portion of the pour cup with the heater.

42. A method as set forth in claim 40 wherein said step of positioning the heater adjacent to the pour cup includes engaging the mold with the heater.

43. A method as set forth in claim 40 further including the steps of maintaining a vacuum in a first housing which encloses the furnace during filling of the at least one article mold cavity with molten metal, said step of removing the mold from the furnace includes moving the mold from the first housing to a second housing, said step of positioning a heater adjacent to the pour cup is performed while the mold is in the second housing.

44. A method as set forth in claim 43 further including the step of moving the heater into the second housing while the mold is in the second housing.

45. A method as set forth in claim 43 further including the step of maintaining a vacuum in the second housing during movement of the mold from the first housing into the second housing and during positioning of the heater adjacent to the mold.

46. A method as set forth in claim 40 further including the step of exhausting gas from the heater during performance of said step of transmitting heat from the burning gas to the upper end portion of the pour cup.

47. A method as set forth in claim 40 wherein said steps of positioning a heater adjacent to the pour cup and transmitting heat from the heater to metal in the pour cup includes positioning a base having a plurality of openings adjacent to the pour cup, said steps of burning the gas at the heater and transmitting heat from the burning gas to the upper end portion of the pour cup includes conducting gas through a first one of the openings in the base toward the metal in the mold and exhausting gas through a second one of the openings in the base.

48. A method of casting, said method comprising the steps of providing a mold having at least one article mold cavity, moving the mold into a furnace which is enclosed by a first housing, filling the at least one article mold cavity with molten metal while the mold is in the furnace, maintaining a vacuum in the first housing which encloses the furnace during filling of the at least one article mold cavity with molten metal, moving the mold from the furnace and the first housing into a second housing, thereafter, positioning a heater above the mold while the mold is in the second housing, and transmitting heat from the heater to metal in the mold, said step of transmitting heat from the heater to metal in the mold is at least partially performed with the heater above the mold.

49. A method as set forth in claim 48 further including the step of moving the heater into the second housing from a location outside the second housing while the mold is in the second housing.

50. A method as set forth in claim 48 wherein said step of moving the mold from the furnace into the second housing is at least partially performed with the heater in the second housing.

51. A method as set forth in claim 48 further including the step of maintaining a vacuum in the second housing during movement of the mold from the furnace into the second housing.

52. A method as set forth in claim 48 further including the step of maintaining a vacuum in the second housing during positioning of the heater above the mold while the mold is in the second housing.

53. A method as set forth in claim 48 wherein said step of positioning a heater above the mold is performed with a panel blocking an entrance to a chamber in the heater, said method further includes moving the panel from the position blocking an entrance to the chamber in the heater to a position in which the panel is ineffective to block the entrance to the chamber in the heater.

54. A method as set forth in claim 48 wherein said step of positioning a heater above the mold includes positioning at least a portion of a mold pour cup in a chamber in the heater.

55. A method as set forth in claim 48 wherein the mold includes a plurality of article mold cavities which are interconnected of a gating system, said step of filling the at least one article mold cavity with molten metal includes conducting molten metal through the gating system to the plurality of article mold cavities, said step of positioning the heater above the mold includes positioning the heater adjacent to and directly above the gating system and upper end portions of the plurality of article mold cavities.

56. A method as set forth in claim 48 wherein said step of transmitting heat from the heater to metal in the mold includes conducting a flow of gas to the heater, burning the gas, and transmitting heat from the burning gas to metal in the mold.

57. A method as set forth in claim 48 wherein said step of positioning a heater above the mold includes engaging a portion of the mold with the heater.

* * * * *